(12) United States Patent
He et al.

(10) Patent No.: US 10,305,057 B2
(45) Date of Patent: May 28, 2019

(54) LIGHT-EMITTING DEVICE AND DISPLAY APPARATUS (71) Applicant: BOE TECHNOLOGY GROUP CO., LTD., Beijing (CN)

(72) Inventors: Yuedi He, Beijing (CN); Yanzhao Li, Beijing (CN); Long Wang, Beijing (CN); Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/529,877

(22) PCT Filed: Nov. 24, 2016

(86) PCT No.: PCT/CN2016/107010
§ 371 (c)(1),
(2) Date: May 25, 2017

(87) PCT Pub. No.: WO2017/140151
PCT Pub. Date: Aug. 24, 2017

(65) Prior Publication Data
US 2018/0351125 A1 Dec. 6, 2018

(30) Foreign Application Priority Data

Feb. 18, 2016 (CN) .......................... 2016 1 0091388

(51) Int. Cl.
*H01L 51/50* (2006.01)
*C09K 11/06* (2006.01)
(Continued)

(52) U.S. Cl.
CPC .......... *H01L 51/5028* (2013.01); *C09K 11/06* (2013.01); *H01L 51/0003* (2013.01);
(Continued)

(58) Field of Classification Search
CPC ....... H01L 51/5028; C09K 11/06; C09D 6/77; G02F 2001/01791
(Continued)

(56) References Cited

U.S. PATENT DOCUMENTS

2007/0138460 A1* 6/2007 Choi ...................... B82Y 20/00
257/13
2009/0039764 A1* 2/2009 Cho ........................ B82Y 10/00
313/504
(Continued)

FOREIGN PATENT DOCUMENTS

CN 101937975 A 1/2011

OTHER PUBLICATIONS

International Search Report and Written Opinion dated Feb. 20, 2017 in PCT/CN2016/107010.
First Office Action dated Feb. 6, 2017 in CN201610091388.X.

*Primary Examiner* — Jami Valentine Miller
(74) *Attorney, Agent, or Firm* — Syncoda LLC; Feng Ma (57) ABSTRACT

The present disclosure provides a light-emitting device and manufacturing method thereof, and a display apparatus containing the light-emitting device. The light-emitting device comprises a quantum dot light-emitting layer, an electron transport layer, and an energy transfer layer. The quantum dot light-emitting layer comprises a quantum dot material. The energy transfer layer is between the quantum dot light-emitting layer and the electron transport layer. The energy transfer layer is configured to facilitate a transfer of energy from the electron transport layer to the quantum dot light-emitting layer such that the quantum dot light-emitting layer has an improved electroluminescence efficiency compared with the quantum dot light-emitting layer having an energy transferred directly from the electron transport layer without the energy transfer layer.

18 Claims, 9 Drawing Sheets

(51) Int. Cl.
  *H01L 51/00*  (2006.01)
  *H01L 51/56*  (2006.01)
(52) U.S. Cl.
  CPC ........ *H01L 51/0085* (2013.01); *H01L 51/502* (2013.01); *H01L 51/5016* (2013.01); *H01L 51/5072* (2013.01); *H01L 51/56* (2013.01); *C09K 2211/185* (2013.01); *H01L 2251/558* (2013.01)
(58) Field of Classification Search
  USPC .............................................. 257/13; 438/20
  See application file for complete search history.

(56) References Cited

U.S. PATENT DOCUMENTS

2011/0291071 A1* 12/2011 Kim ...................... H01L 51/502
                                                            257/13
2017/0069852 A1*  3/2017 Kanamoto ......... C07D 491/048

* cited by examiner

__LIGHT-EMITTING DEVICE AND DISPLAY APPARATUS__

CROSS-REFERENCE TO RELATED APPLICATIONS

The present application claims priority to Chinese Patent Application No. 201610091388.X filed on Feb. 18, 2016 and to Chinese Patent Application No. 201610237544.9 filed on Apr. 15, 2016, the disclosures of which are hereby incorporated by reference in their entirety.

TECHNICAL FIELD

This disclosure relates generally to the field of display technology, and more specifically to a light-emitting device and manufacturing method thereof, and a display apparatus.

BACKGROUND

Quantum dots (QDs) are a type of nanoparticles containing Group II-VI or Group III-V elements, and have characteristics such as broad absorption spectra, narrow emission bands, tunable color purity, high fluorescence quantum yields, etc.

Quantum dot light-emitting devices typically have two excitation mechanisms. In a direct carrier injection mechanism, holes from a hole transport layer and electrons from an electron transport layer are respectively injected into a quantum-dot light-emitting layer, and form excitons for light emission. In an energy transfer mechanism, excitons formed at the transport layer directly transfer energy to quantum dots for light emission.

Current QD light-emitting diodes (LEDs) typically include a hole injection layer (HIL), a hole transport layer (HTL), an electron transport layer (ETL), and a quantum dot light-emitting layer. Current design and manufacturing of quantum dot light-emitting devices have focused on optimization of layer structures such as the HIL, HTL, ETL, etc.

SUMMARY

The inventors of the present disclosure have recognized that the valence band of quantum dots is far below the highest occupied orbital energy level of the hole transport layer. As such, hole injection is not ideal, resulting in imbalance of carriers, in turn easily causing current leakage and degradation of the device, and affecting the efficiency and life of the devices.

This disclosure provides a light-emitting device, its manufacturing method and a display apparatus. At least some embodiments disclosed herein can improve the devices with respect to the issue that the poor hole injection affects the performance of the quantum dot light-emitting devices in current technologies.

In a first aspect, a light-emitting device is disclosed herein. The light-emitting device comprises a quantum dot light-emitting layer, an electron transport layer, and an energy transfer layer. The quantum dot light-emitting layer comprises a quantum dot material. The energy transfer layer is between the quantum dot light-emitting layer and the electron transport layer.

The energy transfer layer is configured to facilitate a transfer of energy from the electron transport layer to the quantum dot light-emitting layer such that the quantum dot light-emitting layer has an improved electroluminescence efficiency compared with the quantum dot light-emitting layer having an energy transferred directly from the electron transport layer without the energy transfer layer.

In some embodiments of the light-emitting device, the energy transfer layer comprises a host material and a guest material. The host material is configured to collect holes uncaptured by the quantum dot light-emitting layer to thereby form excitons and transfer energy of the excitons of the host material to excitons of the guest material; and the guest material is configured to sufficiently release the energy from the host material and transfer the released energy to the quantum dot material.

In the light-emitting device as described above, the host material is configured to transfer energy by singlet excitons of the host material transferring energy to singlet excitons of the guest material such that the singlet excitons of the guest material form triplet excitons of the guest material via intersystem crossing (ISC), and to transfer energy by triplet excitons of the host material transferring energy to the triplet excitons of the guest material.

In some embodiments of the light-emitting device, an emission spectrum of the host material can be at least partially overlapped with an absorption spectrum of the guest material.

In some embodiments of the light-emitting device, the host material comprises a first composition with an energy band gap of no less than 2 eV. As such, the first composition can comprise at least one of PVK, CBP, TPCPA, CDBP, MCP, TCTA, or TFB.

In some embodiments of the light-emitting device, the guest material can comprise a second composition capable of generating excitons having a life of more than 100 ns.

In some embodiments of the light-emitting device, the second composition can comprise a phosphorescent composition. The phosphorescent composition can comprise at least one of an iridium complex, a platinum complex, a ruthenium complex, a copper complex, an osmium complex, and a rhenium complex.

In one example of the light-emitting device as described above, the phosphorescent composition can comprise $Ir(ppy)_3$.

In some embodiments of the light-emitting device, an emission spectrum of the guest material can be at least partially overlapped with an absorption spectrum of the quantum dot material.

In some embodiments of the light-emitting device, a doping concentration of the guest material can be about 1%-80%, and preferably can be about 15%-25%. Herein, a doping concentration is referred to as a weight concentration (wt %) of the guest material in the whole energy transfer layer.

In some embodiments of the light-emitting device, a thickness of the energy transfer layer is about 3-40 nm, and preferably can be about 5-15 nm.

In a second aspect, the present disclosure further provides a display apparatus. The display apparatus can comprise the light-emitting device according to any one of the embodiments as described above.

In a third aspect, the present disclosure further provides a method for manufacturing a light-emitting device as described above. The method comprises: forming an energy transfer layer over a quantum dot light-emitting layer or an electron transport layer.

According to some embodiments of the method, forming an energy transfer layer over the quantum dot light-emitting layer or the electron transport layer can be via a deposition process. The deposition process can be selected from one of spin-coating, spraying, printing, sputtering, electron beam evaporation, vacuum deposition, and chemical vapor deposition.

In the method as described above, the deposition process can be spin-coating, and forming an energy transfer layer over the quantum dot light-emitting layer or the electron transport layer can comprise: spin-coating a mixture solution including the host material and the guest material on the quantum dot light-emitting layer or the electron transport layer. As such, spin-coating can be at around 2000-5000 rpm for 60 s.

In some embodiments of the method, after formation, a thickness of the energy transfer layer can be around 3-40 nm.

As such, the host material in the energy transfer layer can collect the holes uncaptured by the quantum dot light-emitting layer, and combine with the electrons e− from the electron transport layer to form excitons. On situations where the host material and the guest material match, the formed excitons can transfer their energy to excitons in the guest material. On situations where the excitons in the guest materials have a relatively long life, the energy of the excitons can be transferred to the quantum dot material in the quantum dot light-emitting layer.

Therefore, the energy transfer layer facilitates the capture of holes by the quantum dot light-emitting layer, and thus optimizing the hole injection. As such, the embodiment as disclosed herein can solve the issue that the poor hole injection affects the performance of the quantum dot light-emitting devices in current technologies.

Additionally, the energy transfer layer as described above can collect and transfer to the quantum dot light-emitting layer the energy that would otherwise have been lost due to the escape of holes, thus capable of effectively increasing the light-emitting efficiency of the quantum dot material. Furthermore, because the hole injection can be optimized by the embodiments disclosed herein, it facilitates maintenance of balance in carriers to thereby reduce current leakage and degradation of the device. As such, the embodiment as disclosed herein can improve the performance of a quantum dot light-emitting device.

Other embodiments may become apparent in view of the following descriptions and drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Figure 1:
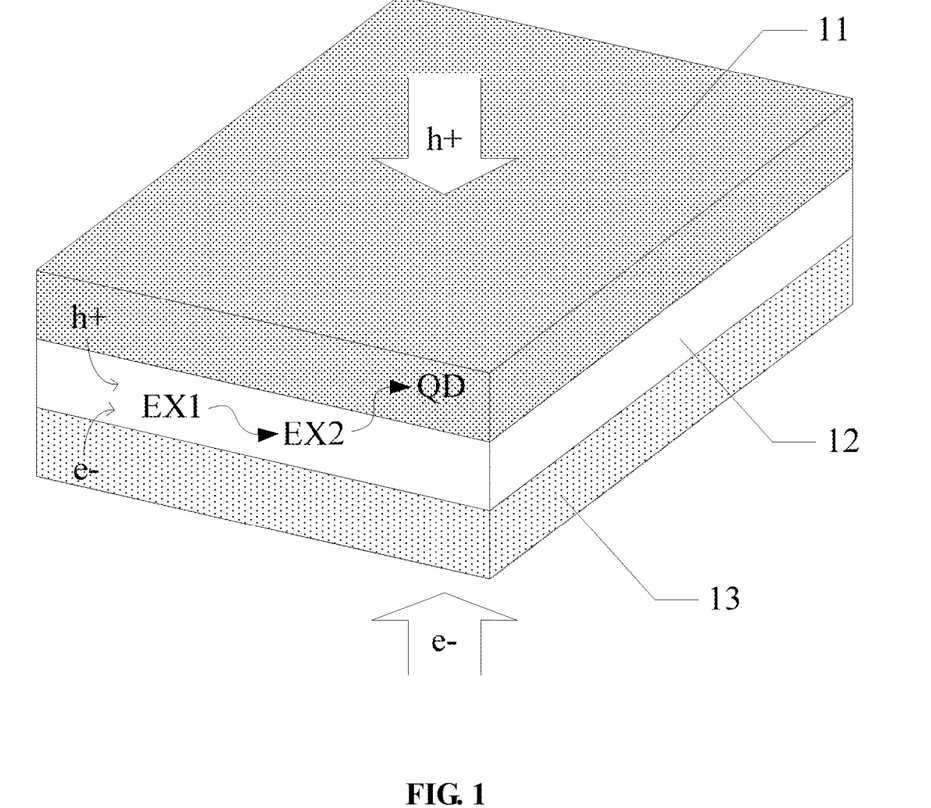
FIG. 1 is a partial cross-sectional view of a light-emitting device according to some embodiment of the disclosure.

FIG. 1 is a partial cross-section view of a light-emitting device according to some embodiment of the disclosure. The light-emitting device includes a quantum dot light-emitting layer 11, an electron transport layer 13, and an energy transfer layer 12, disposed between the quantum dot light-emitting layer 11 and the electron transport layer 13. The energy transfer layer 12 comprises a host material and a guest material.

The host material is configured to collect holes h+ uncaptured by the quantum dot light-emitting layer 11 to form excitons EX1, and then to transfer the energy of the excitons EX1 to excitons EX2 in the guest material. The guest material is configured to slowly release energy from the excitons EX2, and then to transfer the energy to a quantum dot material QD in the quantum dot light-emitting layer 11, whereby the excitons EX2 have a relatively longer life, allowing for sufficient transfer of energy to the quantum dot material QD within a certain time period.

It should be noted that as a primary light-emitting component in the light-emitting device, the quantum dot light-emitting layer 11 comprises a quantum dot material configured to emit light of a given waveband (depending on real needs) upon injection of electrons e− and holes h+. The electron transport layer 13 comprises an electron transport material (ETM) and/or an electron injection material (EIM), configured to inject electrons e− to the quantum dot light-emitting layer 11. It shall be appreciated that the side of the quantum dot light-emitting layer 11 facing the electron transport layer 13 (i.e. the lower side in FIG. 1) is configured to be able to inject holes h+ to the quantum dot light-emitting layer 11 in any ways.

It should be further noted that the host material is a specific type of light-emitting material, configured to capture holes and transfer energy to excitons in the guest material. The guest material is another type of light-emitting material, configured to slowly release the energy from the host material (i.e. spread the energy release process within a time period) and to transfer the energy to the quantum dot material.

In real implementation, specific light-emitting materials shall be selected based on parameters of structures outside the energy transfer layer in the device (especially materials for the quantum dot light emitting layer and the electron transport layer). There are no limitations herein.

Additionally, to achieve the needed energy transfer effect, the concentrations of the host material and the guest material, the ratio of the host material and the guest material, and the thickness of the energy transfer layer, can be configured and there are no limitations herein. The selection of materials and configuration of parameters can be based on theoretical calculation and deduction, and can also be based on other approaches, such as by measuring external quantum efficiency (EQE) through single variable experiments, whose contents are skipped herein.

As such, the host material in the energy transfer layer 12 can collect the holes h+ uncaptured by the quantum dot light-emitting layer 11, and combine with the electrons e− from the electron transport layer 13 to form the excitons EX1.

If the host material and the guest material match, the formed excitons EX1 can transfer their energy to the excitons EX2 in the guest material. If the excitons EX2 in the guest materials have a relatively long life, the energy of the excitons EX2 can be transferred to the quantum dot material QD in the quantum dot light-emitting layer 11.

Herein "relatively long life" refers to the observations that excitons of a material (e.g. triplet excitons in a phosphorescent material having a life of >1 ms) have a comparatively longer life than excitons in a regular material (e.g., singlet excitons in a conventional fluorescent material, having a life of 1-100 ns). Associated with such a feature, the excitons having a longer life as such can have a longer time period to allow for energy transfer to the quantum dot material QD.

Therefore, the energy transfer layer 12 facilitates the capture of holes h+ by the quantum dot light-emitting layer 11, and thus optimizing the hole injection. As such, the embodiment as disclosed herein can at least partially solve the issue that the poor hole injection affects the performance of the quantum dot light-emitting devices in current technologies.

The energy transfer layer as described above can collect and transfer to the quantum dot light-emitting layer the energy that would otherwise have been lost due to the escape of holes, thus capable of effectively increasing the light-emitting efficiency of the quantum dot material. Furthermore, because the hole injection can be optimized by the embodiment disclosed herein, it facilitates maintenance of balance in carriers to thereby reduce current leakage and degradation of the device. As such, the embodiment as disclosed herein can improve the performance of a quantum dot light-emitting device.

It should be further noted that in theory it is possible that the host material can directly transfer the energy of excitons to the quantum dot material without going through any guest material. It is, however, not a primary way of energy transfer in this disclosure. Specifically, due to the concentration quenching effect and the triplet-triplet annihilation (T-T annihilation) effect, the quantum efficiency of energy transfer solely dependent on a host material is relatively low, whereas an energy transfer layer comprising both a host material and a guest material can have a relatively higher quantum efficiency.

As an illustrating example, the energy transfer between the energy transfer layer 12 and the quantum dot light-emitting layer 11 can be as follows. First, the excitons EX1 formed in the host material by capturing the holes h+ that have not been captured by the quantum dot light-emitting layer 11 include singlet excitons S1 and triplet excitons T1.

The singlet excitons S1 can transfer energy to singlet excitons S2 in the guest material via the Förster Energy Transfer mechanism, and the singlet excitons S2 in the guest material can become triplet excitons T2 via intersystem crossing (ISC). The triplet excitons T1 in the host material can directly transfer energy to the triplet excitons T2 in the guest material via the Dexter Energy Transfer mechanism.

Finally, because the triplet excitons T2 in the guest material has a relatively long life, they can transfer the energy to the quantum dot material QD completely within a certain range. The Dexter Energy Transfer mechanism plays a major role at positions of the guest material close to the quantum dot material QD, whereas the Förster Energy Transfer mechanism plays a major role at positions of the guest material far from the quantum dot material QD.

On the basis of the energy transfer mechanisms in the energy transfer layer 12 as described above, people of ordinary skill in the field can configure appropriate energy transfer layer structures according to specific situations.

A host material can be any of PVK (poly(9-vinyl carbazole)), CBP (4,4'-(9-carbazole) biphenyl), TPCPA (4,4',4"-N,N',N"-tris(3-phenyl carbazole) aniline), CDBP (4,4'-N,N'-biscarbazole-2,2'-dimethyl diphenyl), and MCP (3,5-N,N'-dicarbazole benzene). Having a light-emitting material with a wide band gap (triplet has a relatively large energy band gap, for example, ≥2 eV), the host material can effectively transfer the energy from the excitons to the guest material.

Specifically, the higher the energy the triplets in the host material has than the triplets in the guest material, the smaller the quenching constant; and if the triplets in the host material have relatively low energy, the triplet excitons in the guest material can translocate from the guest material to the host material, thereby quenching the quantum efficiency in the device. Thus a host material having a high triplet energy can effectively transfer the energy from excitons to the guest material, thereby realizing a high quantum efficiency.

In some other embodiments where the above energy gap condition is met, a host material can be selected from one of carbazole-based materials such as TCTA (tri-(4-carbazol-9-yl phenyl)amine), and a polyfluorene material such as TFB (poly[(9,9-second octyl fluorene-2,7-second base) CO (4,4'-(n-(4-sec butyl phenyl) diphenylamine]). There are no limitations herein.

A guest material can be any of phosphorescent materials, such as iridium (Ir) complexes, platinum (Pt) complexes, ruthenium (Ru) complexes, and copper (Cu) complexes. A guest material comprising an organic complex having a heavy (noble) metal has the following advantages.

First, this type of material has a high intersystem crossing (ISC) capability, which facilitates complete triplet light emission. Second, this type of material is a good energy receiver during the energy transfer process, and as such, this type of material can sufficiently receive energy from a host material and transfer the energy to a quantum dot material, thereby increasing the quantum efficiency of the device.

In some other embodiments where the above energy transfer feature is met, a guest material can be selected from other materials such as osmium (Os) complexes and rhenium (Re) complexes. There are no limitations herein.

In addition, the energy transfer ranges for the host material and for the guest material in the energy transfer layer need to be configured such that the emission spectrum of the host material matches the absorption spectrum of the guest material. In other words, selection of the host and guest materials needs to avoid that the host material has a quenching effect on the guest material. The emission spectrum of the host material needs to have a partial overlap with, or have an energy match with, the absorption spectrum of the guest material (the extent for overlapping depends on needs).

In a similar sense, the guest material needs to have an energy match with the quantum dot material, i.e. the emission spectrum of the guest material matches with the absorption spectrum of the quantum dot material (at least partially overlapped, and the extent for overlapping depends on needs). Such configuration provides a fundamental basis to ensure the quantum efficiency of the devices.

Figure 2:
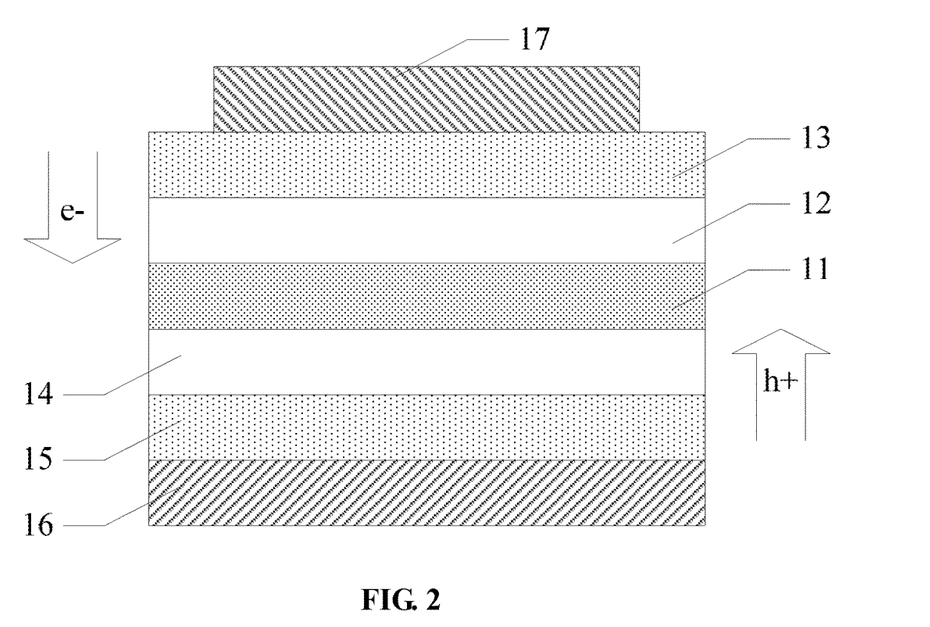
FIG. 2 is cross-sectional view of a light-emitting device according to some embodiment of the disclosure.

As a more detailed illustration, FIG. 2 is cross-section view of a light-emitting device according to some embodiment of the disclosure. The light-emitting device includes, in a bottom-to-top order, an anode layer 16, a hole injection layer 15, a hole transport layer 14, a quantum dot light-emitting layer 11, an energy transfer layer 12, an electron transport layer 13, and a cathode layer 17.

The anode layer 16 is configured to couple with a positive voltage of the light-emitting device, and can comprise at least one of a glass, Indium tin oxide, fluorine doped tin oxide, indium zinc oxide, copper indium oxide, aluminum doped with zinc oxide, gallium doped zinc oxide, cadmium doped zinc oxide, nickel, gold, platinum, and palladium. The thickness of the anode layer 16 can be in a range of 5-1000 nm, and preferably of 100-300 nm.

The hole injection layer 15 is configured to inject holes h+ to the quantum dot light-emitting layer 11, and can comprise a material such as PEDOT:PSS (poly(3,4-B two 3-ethoxyl thiophene)-poly(styrenesulfonate). Its thickness can be in a range of 1-100 nm, and preferably of 10-50 nm.

The hole transport layer 14 is configured to transfer the holes h+ from the hole injection layer 15 to the quantum dot light-emitting layer 11, and can comprise at least one of poly-TPD (poly-(N,N'-bis-(4-butyl phenyl)-N,N'-bisphenyl benzidine), alpha NPD (N,N'-diphenyl-N,N'-bis (alpha naphthyl)-1,1'-biphenyl)-4,4'-second amine) (n,n'-bis(4-(N, N'-phenyl-amino)phenyl)-N,n'-diphenyl benzidine). The thickness of the hole transport layer 14 can be in a range of 20-500 nm, and preferably of 50-100 nm.

The quantum dot light-emitting layer 11 is configured to emit light under the injection of the holes h+ and the electrons e−, and can comprise a quantum dot material having a core-shell nano-structure, wherein the quantum dot material can emit at least one of white light, blue light (e.g. 100-480 nm), red light (e.g. 550-650 nm), and green light (e.g. 480-550 nm).

For example, the quantum dot material can be a core-shell structured material comprising zinc sulfide nano-semiconductor material, which can have a particle diameter of about 6 nm for a red quantum dot material, of about 7 nm for a green quantum dot material, and of about 10 nm for a blue quantum dot material. Besides the quantum dot material, the quantum dot light-emitting layer 11 can further comprise quantum dot ligands, such as phosphate ligands, thiol ligands, and carboxylate ligands.

The energy transfer layer 12 comprises CBP (host material) and Ir(ppy)$_3$ (guest material), and relative to the host material, the guest material has a doping concentration of 1%-80%, and preferably 5%-30%, and more preferably 15%-25%. The thickness of the energy transfer layer can be in a range of 1-40 nm, and preferably of 5-15 nm.

The electron transport layer 13 is configured to inject electrons from the cathode layer 17 to the quantum dot light-emitting layer 11, and comprises an electron transport material (ETM) or an electron injection material (EIM), selected from at least one of pyridine, pyrimidine, pyridazine, pyrazine, thiazole, quinolone, quinoxaline, anthracene, benzo anthracene, pyrene, perylene, benzimidazole, triazine, ketone, phosphine oxide and phenazine and their derivatives, as well as the triarylborane or other heterocyclic compounds containing O, S or N with a low LUMO (lowest unoccupied molecular orbital). The thickness of the electron transport layer 13 can be in a range of 20-500 nm, and preferably of 50-100 nm.

The cathode layer 17 is configured to couple to the positive (negative?) voltage of the light-emitting device, and can comprise at least one of Al, LiF/Al, Ca, Ba, Ca/Al and Ag. The thickness of the cathode layer 17 can be in a range of 5-1000 nm, and preferably of 100-200 nm.

It shall be appreciated that the selection of the anode layer and the cathode layer depends on the display needs. In situations where the light-emitting device is for double-side display, both the anode layer and the cathode layer need to be formed by transparent conductive materials. In situations where the light-emitting device is for single-side display, one of the anode layer and the cathode layer needs to be formed by transparent conductive material. In real implementation, people of ordinary skills in the field can configure based on the display needs, and there are no limitations herein.

Figure 3:
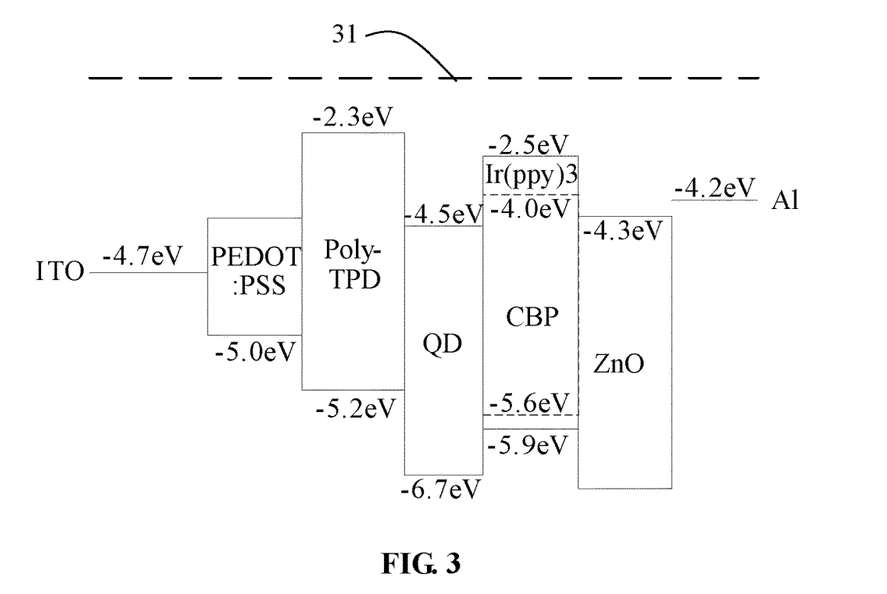
FIG. 3 is an energy level diagram of a light-emitting device according to some embodiment of the disclosure.

In a specific example, the light-emitting device as described above has the following compositions. The anode layer 16 comprises ITO; the hole injection layer 15 comprises PEDOT:PSS; the hole transport layer 14 comprises poly-TPD; the quantum dot material comprises a core-shell nanostructured material of zinc sulfide; the energy transfer layer 12 comprises CBP and Ir(ppy)$_3$; the electron transport layer 13 comprises ZnO; and the cathode layer comprises Al. An energy level diagram of the light-emitting device based on this embodiment of the disclosure is illustrated in FIG. 3, where the dashed line 31 represents a vacuum energy level.

Alight-emitting device that contains no energy transfer layer is illustrated as a control for comparison. The anode layer 16 comprises ITO; the hole injection layer 15 comprises PEDOT:PSS; the hole transport layer 14 comprises poly-TPD; the quantum dot material comprises a core-shell nanostructured material of zinc sulfide; the electron transport layer 13 comprises ZnO; and the cathode layer comprises Al. The energy level diagram of this light-emitting device as described above is shown in FIG. 4.

Figure 4:
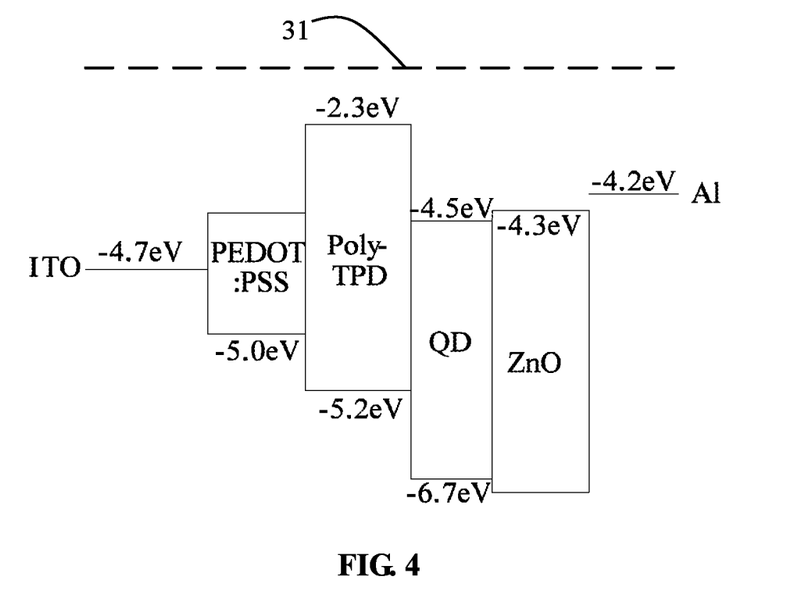
FIG. 4 is an energy level diagram of a comparison light-emitting device.

As illustrated in FIG. 4, the valence band of quantum dot material QD is far below the highest occupied orbital energy level of the hole transport layer (Poly-TPD), thus the hole injection is not ideal, resulting in imbalance of carriers, in turn easily causing current leakage and degradation of the device, and affecting the efficiency and life of the devices.

To solve these above issues, current technologies primarily focus on improving the structures and compositions of the hole injection layer and the hole transport layer, while have limited optimization on the device performance. Performance on hole injection is related not only to how to inject holes, but also to the capturing of holes by the quantum dot materials.

Figure 5:
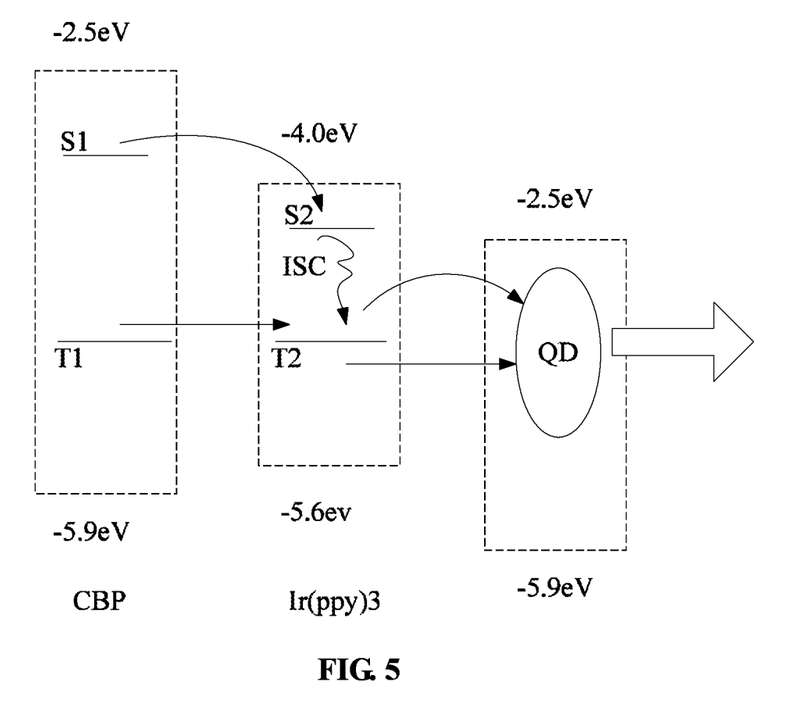
FIG. 5 is a schematic diagram of the working principle of an energy transfer layer in a light-emitting device according to some embodiment of the disclosure.

FIG. 5 is a schematic diagram of the working principle of an energy transfer layer in a light-emitting device according to some embodiment of the disclosure. As shown in FIG. 5, the host material CBP captures the holes h+ that have not been captured by the quantum dot material QD and forms singlet excitons S1 and triplet excitons T1.

The singlet excitons S1 can transfer energy to singlet excitons S2 in the guest material Ir(ppy)$_3$ via the Förster Energy Transfer mechanism, and the singlet excitons S2 in the guest material Ir(ppy)$_3$ can become triplet excitons S2 via intersystem crossing (ISC). The triplet excitons T1 in the host material CBP can directly transfer energy to the triplet excitons S2 in the guest material Ir(ppy)$_3$ via the Dexter Energy Transfer mechanism. Finally, because the triplet excitons S2 in the guest material Ir(ppy)$_3$ has a relatively long life, they can transfer the energy to the quantum dot material QD completely within a certain range.

The Dexter Energy Transfer mechanism plays a major role at positions of the guest material Ir(ppy)$_3$ close to the quantum dot material QD, whereas the Förster Energy Transfer mechanism plays a major role at positions of the guest material Ir(ppy)$_3$ far from the quantum dot material QD. As such, under the complementation of energy from the guest material Ir(ppy)$_3$, the quantum dot material QD can have a higher quantum efficiency and a higher light-emitting efficiency than that without the energy transfer layer.

Figure 6:
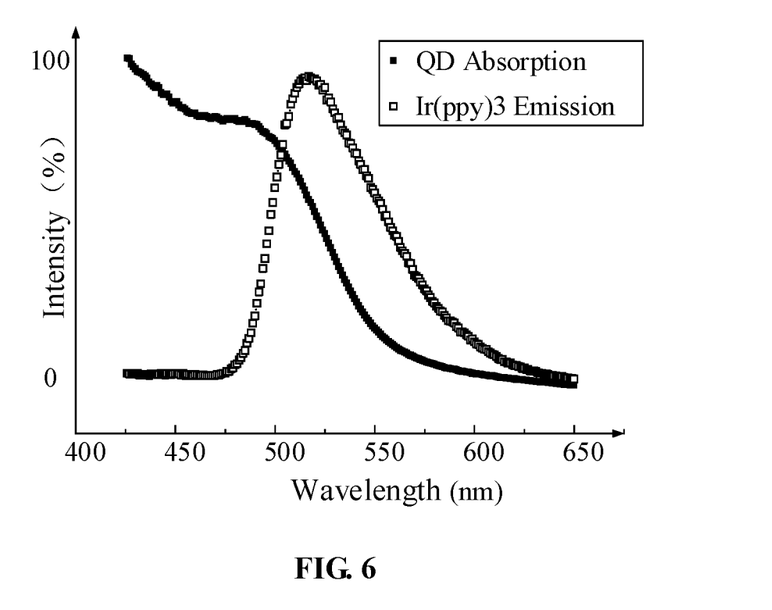
FIG. 6 illustrates test results of the absorption spectrum of a quantum dot material and the emission spectrum of a guest material in a light-emitting device according to some embodiment of the disclosure.

With regard to the energy match between the guest material and the quantum dot material, FIG. 6 shows the test results of the absorption spectrum of a quantum dot material and the emission spectrum of a guest material in a light-emitting device according to some embodiment of the disclosure. In FIG. 6, the energy match between the guest material and the quantum dot material is shown primarily by the test on the emission by the guest material Ir(ppy)$_3$ and by the test on the absorption by the quantum dot material QD.

As can be seen, the emission spectrum of the guest material Ir(ppy)$_3$ and the absorption spectrum of the quantum dot material QD have a high-level overlap at a wavelength ranging 475-500 nm, thus the guest material and the quantum dot material have a good energy match.

It should be noted that the above-described optimization refers to improved device properties, such as a higher light-emitting efficiency or a higher quantum efficiency. For the light-emitting device as shown in FIG. 3, the relation curve of the light-emitting efficiency C.E. (Cd/A) with respect to the current density J (mA/cm2), and the relation curve of the external quantum efficiency (EQE, %) with respect to the current density J (mA/cm2), both under the Ir(ppy)$_3$:CBP doping concentrations of 1%, 15% and 80% respectively, have been tested whose results are respectively shown in FIG. 7 and FIG. 8.

Figure 7:
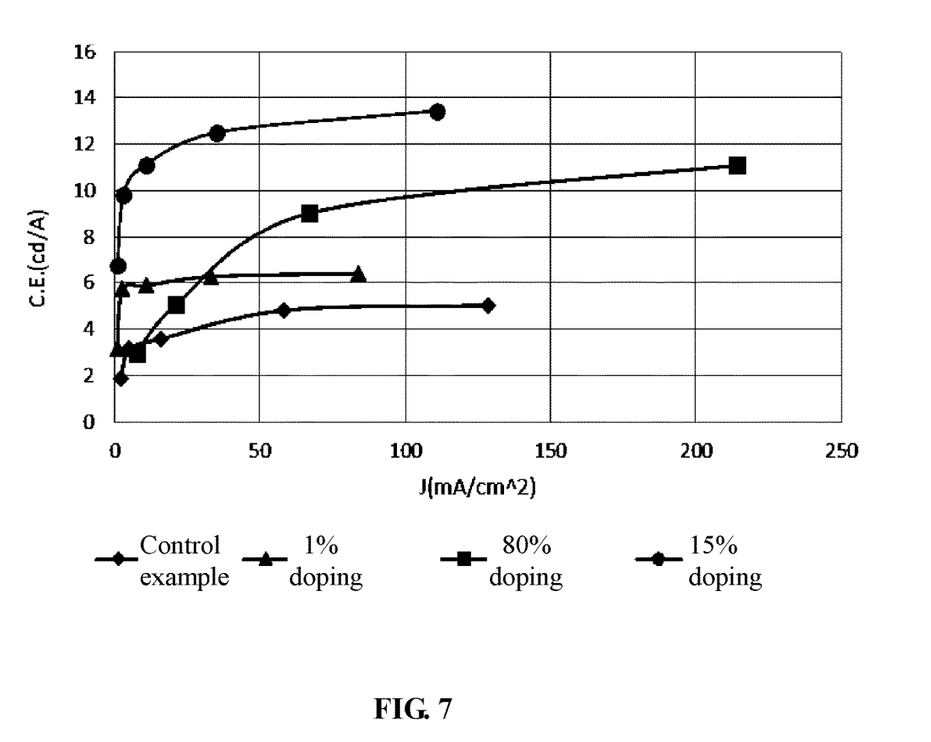
FIG. 7 illustrates test results of a relationship between current density and light emission efficiency at different doping concentrations in a light-emitting device according to some embodiment of the disclosure.
Figure 8:
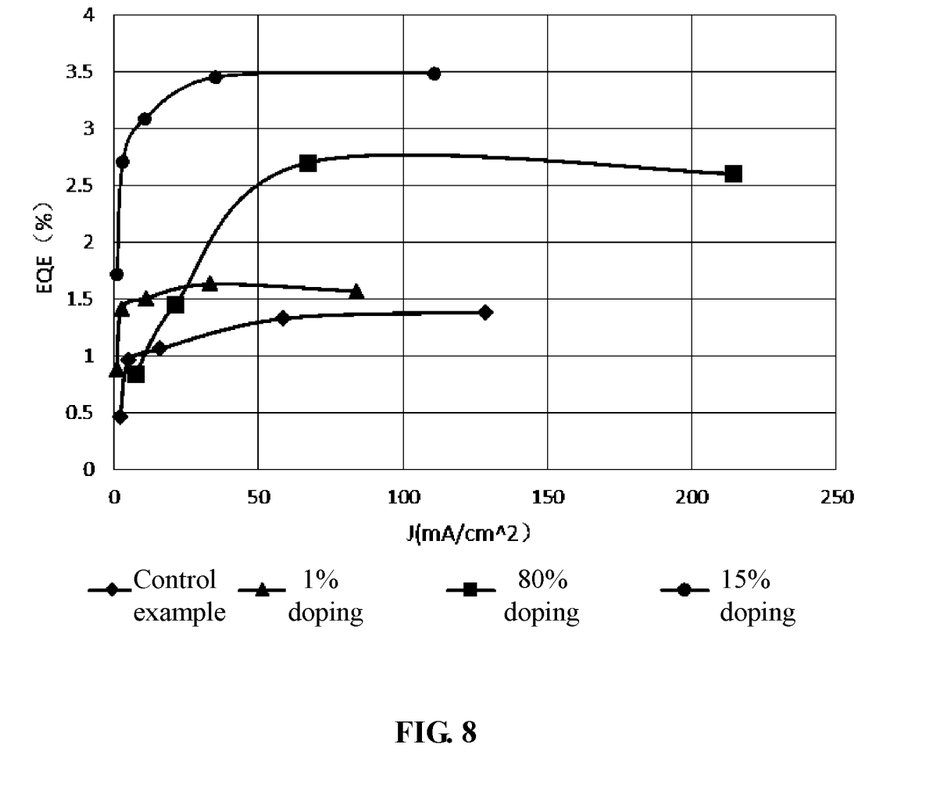
FIG. 8 illustrates test results of a relationship between current density and external quantum efficiency at different doping concentrations in a light-emitting device according to some embodiment of the disclosure.

FIG. 7 shows the test results of current density-light emission efficiency relationship at different doping concentrations in the light-emitting device, and FIG. 8 shows the test results of current density-external quantum efficiency relationship at different doping concentrations in the light-emitting device.

In both FIG. 7 and FIG. 8, the testing results for the control (containing no energy transfer layer) have also been shown. Within 10-100 mA/cm2 of the current density, a range of great significance to the light-emitting performance of the device, the curves for the embodiment are both higher than the curves for the control, which all correspond to the doping concentration of 1%, 15% and 80% respectively, and the light-emitting efficiency C.E. and the external quantum efficiency EQE at the doping concentration of 15% are remarkably higher than those at other doping concentrations.

As such, within 1%-80% of the guest material-host material doping concentration, the embodiment as disclosed herein can achieve a better performance than current technologies, and furthermore based on other testing data that are not shown, the embodiment can achieve an even more better performance within 15%-25% of the doping concentration.

In another illustrating example, as for the light-emitting device as shown in FIG. 3, the relation curve of the light-emitting efficiency C.E. (Cd/A) with respect to the current density J (mA/cm2), and the relation curve of the external quantum efficiency (EQE, %) with respect to the current density J (mA/cm2), both under the energy transfer layer thickness of 3 nm, 15 nm and 40 nm respectively, have been tested and their results are respectively shown in FIG. 9 and FIG. 10.

Figure 9:
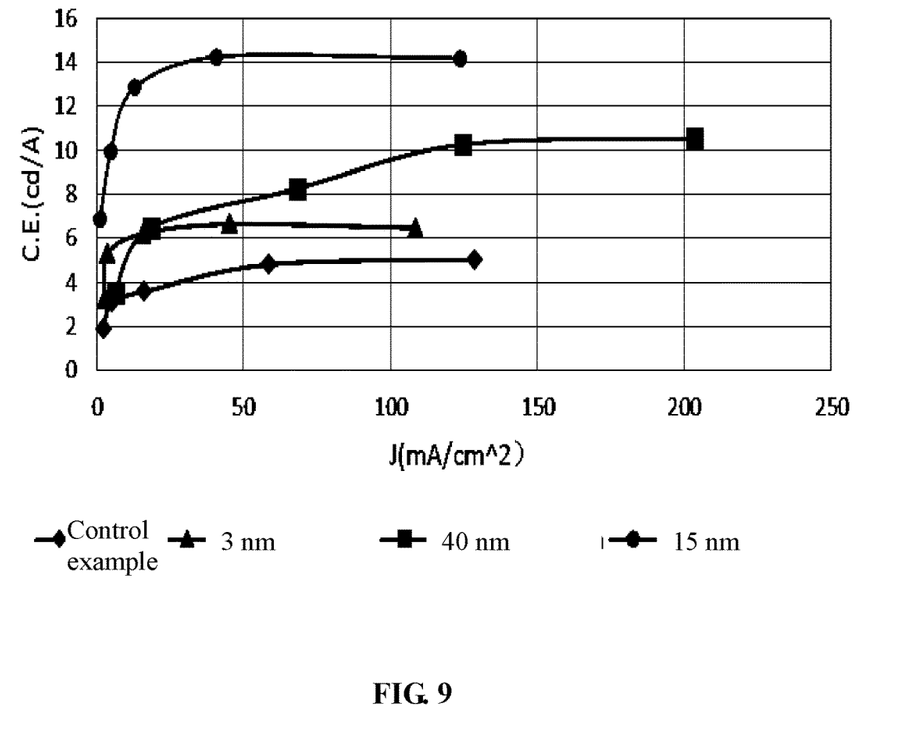
FIG. 9 illustrates test results of a relationship between current density and light emission efficiency in energy transfer layers of different thickness in a light-emitting device according to some embodiment of the disclosure.
Figure 10:
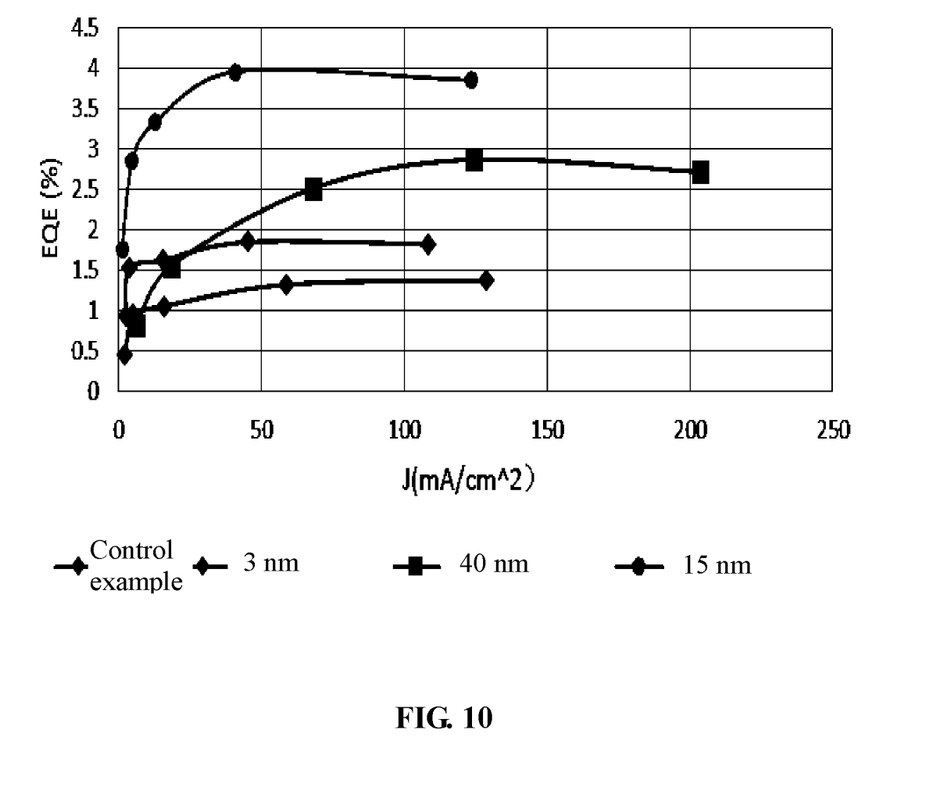
FIG. 10 illustrates test results of a relationship between current density and external quantum efficiency in energy transfer layers of different thickness in a light-emitting device according to some embodiment of the disclosure.

FIG. 9 shows the test results of current density-light emission efficiency relationship in energy transfer layers of different thickness in the light-emitting device, and FIG. 10 shows the test results of current density-external quantum efficiency relationship in energy transfer layers of different thickness in the light-emitting device.

In both FIG. 9 and FIG. 10, the testing results for the control (containing no energy transfer layer) have also been shown. Within 10-100 mA/cm2 of the current density, a range of great significance to the light-emitting performance of the device, the curves for the embodiment are both higher than the curves for the control (containing no energy transfer layer), which correspond to the energy transfer layer thickness of 3 nm, 15 nm and 40 nm respectively, and the light-emitting efficiency C.E. and the external quantum efficiency EQE under the energy transfer layer thickness of 15 nm are remarkably higher than those under other energy transfer layer thicknesses.

As such, within a thickness range of 3-40 nm for the energy transfer layer, the embodiment as disclosed herein can achieve a better performance than current technologies, and furthermore based on other testing data that are not shown, the embodiment can achieve an even more better performance within a thickness range of 5-15 nm for the energy transfer layer.

Figure 11:
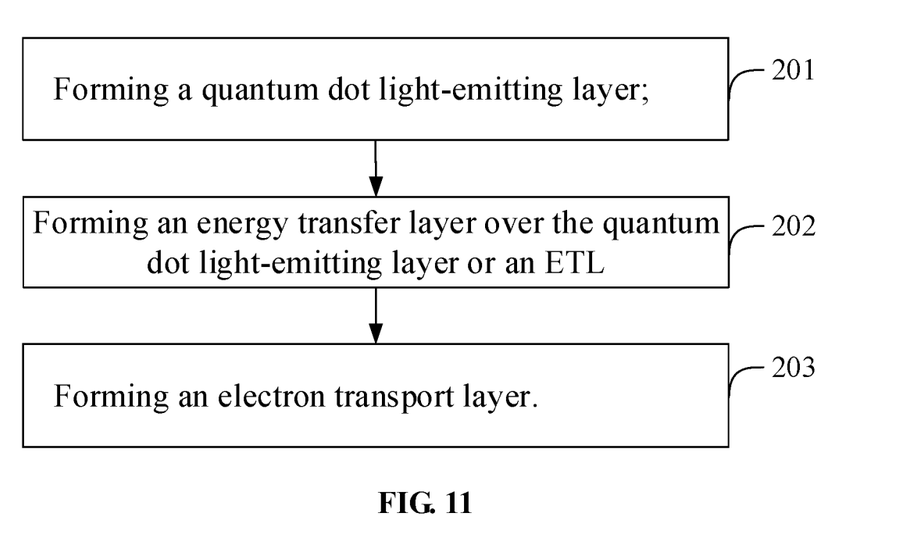
FIG. 11 is a flow chart of a method for manufacturing a light-emitting device according to some embodiment of the disclosure.

FIG. 11 is a flow chart of a method for manufacturing a light-emitting device according to some embodiment of the disclosure. The method comprises:

Step 201: forming a quantum dot light-emitting layer;

Step 202: forming an energy transfer layer over the quantum dot light-emitting layer (or an electron transport layer if the electron transport layer is already formed);

Step 203: forming an electron transport layer.

The energy transfer layer is configured to have a same structure of the energy transfer layer as shown in FIG. 1, i.e. the energy transfer layer comprises a host material and a guest material, wherein the host material is configured to collect holes uncaptured by the quantum dot light-emitting layer so as to form excitons and then to transfer energy of the excitons to excitons in the guest material, and the guest material is configured to slowly release the energy from the excitons, and then to transfer the energy to a quantum dot material QD in the quantum dot light-emitting layer.

It should be noted that in the method as described above, Step 201 through Step 203 can be performed in a reverse order, i.e. the structure as shown in FIG. 1 can be manufactured in a bottom-to-top order, or in a top-to-bottom order. There are no limitations herein.

The method as disclosed in this embodiment can be applied to any of the light-emitting devices as described above. The configuration of the energy transfer layer disclosed herein can solve the issue that the poor hole injection influences the performance of the light-emitting devices in current technologies.

Additionally, the energy transfer layer as described above can collect and transfer to the quantum dot light-emitting layer the energy that would otherwise have been lost due to the escape of holes, thus capable of effectively increasing the light-emitting efficiency of the quantum dot material. Furthermore, because the hole injection can be optimized by the embodiment disclosed herein, it facilitates maintenance of balance in carriers to thereby reduce current leakage and degradation of the device. As such, the embodiment as disclosed herein can improve the performance of a quantum dot light-emitting device.

In some embodiments, Step 202: forming an energy transfer layer over the quantum dot light-emitting layer or an electron transport layer, can comprise: spin-coating a mixture solution containing the host material and the guest material on the quantum dot light-emitting layer or an electron transport layer, so as to form the energy transfer layer. It will be appreciated that the energy transfer layer as described above can be formed by spin-coating the host material-guest material mixture solution.

As such, in the process of manufacturing a light-emitting device between the anode layer and the cathode layer by spin-coating in a layer-by-layer approach, the energy transfer layer can be conveniently and cost-effectively added between the quantum dot light-emitting layer and an electron transport layer to manufacture the light-emitting device as described above, which can lead to a great improvement of the performance of the device.

The manufacture method disclosed herein involves a deposition process to fabricate any one or multiple structures including the hole injection layer, the hole transport layer, the quantum dot light-emitting layer, the electron transport layer, the cathode layer, and the anode layer. The deposition process can include spin coating, spraying or printing, and can also include sputtering, electron beam evaporation, vacuum deposition, or chemical vapor deposition, and there are no limitations herein. It should be noted that after formation of the structures in the embodiment as disclosed above, it needs to avoid the destruction of the structure.

In some embodiment (Embodiment 1), the method for manufacturing a light-emitting device can comprise the following steps (not shown in figures):

Step S01: cleansing a side of a glass substrate, wherein the side of the glass substrate is configured to form a transparent anode (ITO) layer thereon. The step specifically includes: cleansing using deionized water and ethanol; treating with ultrasound for 20 minutes; quickly drying with nitrogen gun, and treating using ozone for 10 minutes, so as to cleanse the surface of the ITO for enhancing the working function of the anodes in the light-emitting device.

Step S02: spin-coating PEDOT:PSS on the anode layer (ITO) on the cleansed glass substrate at 3500 rpm for 45 s in ambient air, annealing in the air at 120° C. for 20 m, so as to get rid of the liquid yet to be evaporated and to form a hole injection layer (layer of PEDOT:PSS).

Step S03: spin-coating a poly-TPD solution (10 mg/ml) on the layer of PEDOT:PSS at 2500 rpm for 45 s in a glove box; annealing in the glove box at 110° C. for 30 m, so as to form a hole transport layer (layer of poly-TPD).

Step S04: spin-coating a quantum dot material solution (containing 10 mg/ml of core-shell structured CdSe/ZnS) on the layer of poly-TPD at 2000 rpm for 60 s, so as to form a quantum dot light-emitting layer.

Step S05: spin-coating an $Ir(ppy)_3$:CBP solution with 5% doping concentration on the quantum dot light-emitting layer at 3000 rpm for 60 s, so as to form an energy transfer layer.

Step S06: spin-coating an ZnO-ethanol solution (45 mg/ml) on the energy transfer layer at 4000 rpm for 45 s, so as to form an electron transport layer.

Step S07: vacuum-depositing metal Al on the electron transport layer in a vacuum evaporation chamber, so as to form a cathode layer to complete the manufacturing of the light-emitting device.

In another embodiment (Embodiment 2), Step S05 can be replaced with: spin-coating an $Ir(ppy)_3$:CBP solution with 10% doping concentration on the quantum dot light-emitting layer at 3000 rpm for 60 s, so as to form an energy transfer layer.

In another embodiment (Embodiment 3), Step S05 can be replaced with: spin-coating an $Ir(ppy)_3$:CBP solution with 15% doping concentration on the quantum dot light-emitting layer at 3000 rpm for 60 s, so as to form an energy transfer layer.

In another embodiment (Embodiment 4), Step S05 can be replaced with: spin-coating an $Ir(ppy)_3$:CBP solution with 20% doping concentration on the quantum dot light-emitting layer at 3000 rpm for 60 s, so as to form an energy transfer layer.

In another embodiment (Embodiment 5), Step S05 can be replaced with: spin-coating an $Ir(ppy)_3$:CBP solution with 25% doping concentration on the quantum dot light-emitting layer at 3000 rpm for 60 s, so as to form an energy transfer layer.

In another embodiment (Embodiment 6), Step S05 can be replaced with: spin-coating an $Ir(ppy)_3$:CBP solution with 30% doping concentration on the quantum dot light-emitting layer at 3000 rpm for 60 s, so as to form an energy transfer layer.

In another embodiment (Embodiment 7), Step S05 can be replaced with: spin-coating an $Ir(ppy)_3$:CBP solution with 15% doping concentration on the quantum dot light-emitting layer at 2000 rpm for 60 s, so as to form an energy transfer layer.

In another embodiment (Embodiment 8), Step S05 can be replaced with: spin-coating an $Ir(ppy)_3$:CBP solution with 15% doping concentration on the quantum dot light-emitting layer at 2500 rpm for 60 s, so as to form an energy transfer layer.

In another embodiment (Embodiment 9), Step S05 can be replaced with: spin-coating an $Ir(ppy)_3$:CBP solution with 15% doping concentration on the quantum dot light-emitting layer at 3500 rpm for 60 s, so as to form an energy transfer layer.

In another embodiment (Embodiment 10), Step S05 can be replaced with: spin-coating an $Ir(ppy)_3$:CBP solution with 15% doping concentration on the quantum dot light-emitting layer at 4000 rpm for 60 s, so as to form an energy transfer layer.

In another embodiment (Embodiment 11), Step S05 can be replaced with: spin-coating an $Ir(ppy)_3$:CBP solution with 15% doping concentration on the quantum dot light-emitting layer at 4500 rpm for 60 s, so as to form an energy transfer layer.

In another embodiment (Embodiment 12), Step S05 can be replaced with: spin-coating an $Ir(ppy)_3$:CBP solution with 15% doping concentration on the quantum dot light-emitting layer at 5000 rpm for 60 s, so as to form an energy transfer layer.

The experimental parameters for Embodiments 1-12 are summarized in Table 1.

|  | Embodiment | | | | | |
| --- | --- | --- | --- | --- | --- | --- |
|  | #1 | #2 | #3 | #4 | #5 | #6 |
| Spinning Speed (rpm) | 3000 | 3000 | 3000 | 3000 | 3000 | 3000 |
| Doping Concentration (wt %) | 5% | 10% | 15% | 20% | 25% | 30% |

|  | Embodiment | | | | | |
| --- | --- | --- | --- | --- | --- | --- |
|  | #7 | #8 | #9 | #10 | #11 | #12 |
| Spinning Speed (rpm) | 2000 | 2500 | 3500 | 4000 | 4500 | 5000 |
| Doping Concentration (wt %) | 15% | 15% | 15% | 15% | 15% | 15% |

It should be appreciated that by spin-coating the Ir(ppy)$_3$:CBP solution with different doping concentrations and at different spinning speed, but for a same spinning time period, the energy transfer layer of specific composition and thickness can be configured.

It should be noted that terms such as "first" and "second" are intended only to distinguish one object/step from another object/step, and do not necessarily require or imply that these objects/steps have any actual relationship or order. Terms such as "comprising," "including," "containing," or other non-exclusive terms are intended to include not only the elements/steps that are specified in the process, method, object, or apparatus, but also the elements that are not specified, such as those elements/steps typically included in the process, method, object, or apparatus. As such, the elements/steps behind the terms "comprising," "including," "containing," or alike, shall be interpreted to non-exclusively include other elements/steps.

It should be noted that terms such as "top," and "bottom," are intended only for convenience and simplification in description of the invention as disclosed herein, and do not imply that the elements necessarily have specific positions and thus shall not constitute limitations to the disclosure. Unless specified otherwise, terms "couple" or "connect" shall be interpreted in a broadest sense: for example, they can be interpreted to refer to a mechanic connection or an electric connection, a fixed connection, a detachable connection, or an integrated connection, a direct connection or an indirect connection which requires an intermediate medium, or a internally coupling between two elements, etc.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting device, comprising:
a quantum dot light-emitting layer, comprising a quantum dot material;
an electron transport layer; and
an energy transfer layer, between the quantum dot light-emitting layer and the electron transport layer;
wherein:
the energy transfer layer is configured to facilitate a transfer of energy from the electron transport layer to the quantum dot light-emitting layer such that the quantum dot light-emitting layer has an improved electroluminescence efficiency compared with the quantum dot light-emitting layer having an energy transferred directly from the electron transport layer without the energy transfer layer;
the energy transfer layer comprises a host material and a guest material;
the host material is configured to collect holes uncaptured by the quantum dot light-emitting layer to thereby form excitons and transfer energy of the excitons of the host material to excitons of the guest material;
the guest material is configured to sufficiently release the energy from the host material and transfer the released energy to the quantum dot material; and
the host material comprises a first composition with an energy band gap of no less than 2 eV.

2. The light-emitting device of claim 1, wherein the host material is configured to transfer energy by:
singlet excitons of the host material transferring energy to singlet excitons of the guest material such that the singlet excitons of the guest material form triplet excitons of the guest material via intersystem crossing (ISC); and
triplet excitons of the host material transferring energy to the triplet excitons of the guest material.

3. The light-emitting device of claim 1, wherein an emission spectrum of the host material is at least partially overlapped with an absorption spectrum of the guest material.

4. The light-emitting device of claim 1, wherein the first composition comprises at least one of PVK, CBP, TPCPA, CDBP, MCP, TCTA, or TFB.

5. The light-emitting device of claim 1, wherein the guest material comprises a second composition capable of generating excitons having a life of more than 100 ns.

6. The light-emitting device of claim 1, wherein the second composition comprises a phosphorescent composition, wherein the phosphorescent composition comprising at least one of an iridium complex, a platinum complex, a ruthenium complex, a copper complex, an osmium complex, and a rhenium complex.

7. The light-emitting device of claim 6, wherein the phosphorescent composition comprises Ir(ppy)$_3$.

8. The light-emitting device of claim 1, wherein an emission spectrum of the guest material is at least partially overlapped with an absorption spectrum of the quantum dot material.

9. A light-emitting device, comprising:
a quantum dot light-emitting layer, comprising a quantum dot material;
an electron transport layer; and
an energy transfer layer, between the quantum dot light-emitting layer and the electron transport layer;
wherein:
the energy transfer layer is configured to facilitate a transfer of energy from the electron transport layer to the quantum dot light-emitting layer such that the quantum dot light-emitting layer has an improved electroluminescence efficiency compared with the quantum dot light-emitting layer having an energy transferred directly from the electron transport layer without the energy transfer layer;

the energy transfer layer comprises a host material and a guest material;

the host material is configured to collect holes uncaptured by the quantum dot light-emitting layer to thereby form excitons and transfer energy of the excitons of the host material to excitons of the guest material;

the guest material is configured to sufficiently release the energy from the host material and transfer the released energy to the quantum dot material; and a doping concentration of the guest material is about 1%-80%.

10. The light-emitting device of claim 9, wherein the doping concentration of the guest material is about 15%-25%.

11. The light-emitting device of claim 1, wherein a thickness of the energy transfer layer is about 3-40 nm.

12. The light-emitting device of claim 11, wherein the thickness of the energy transfer layer is about 5-15 nm.

13. A display apparatus, comprising the light-emitting device according to claim 1.

14. A method for manufacturing a light-emitting device according to claim 1, comprising:

forming an energy transfer layer over a quantum dot light-emitting layer or an electron transport layer.

15. The method according to claim 14, wherein the forming an energy transfer layer over the quantum dot light-emitting layer or the electron transport layer is via a deposition process, selected from one of spin-coating, spraying, printing, sputtering, electron beam evaporation, vacuum deposition, and chemical vapor deposition.

16. The method according to claim 15, wherein the deposition process is spin-coating, and forming an energy transfer layer over the quantum dot light-emitting layer or the electron transport layer comprises:

spin-coating a mixture solution including the host material and the guest material on the quantum dot light-emitting layer or the electron transport layer.

17. A method for manufacturing a light-emitting device comprising:

a quantum dot light-emitting layer, comprising a quantum dot material;

an electron transport layer; and an energy transfer layer, between the quantum dot light-emitting layer and the electron transport layer;

wherein:

the energy transfer layer is configured to facilitate a transfer of energy from the electron transport layer to the quantum dot light-emitting layer such that the quantum dot light-emitting layer has an improved electroluminescence efficiency compared with the quantum dot light-emitting layer having an energy transferred directly from the electron transport layer without the energy transfer layer;

the method comprising:

forming an energy transfer layer over a quantum dot light-emitting layer or an electron transport layer;

wherein:

the forming an energy transfer layer over the quantum dot light-emitting layer or the electron transport layer is via a deposition process, selected from one of spin-coating, spraying, printing, sputtering, electron beam evaporation, vacuum deposition, and chemical vapor deposition;

the deposition process is spin-coating, and the forming an energy transfer layer over the quantum dot light-emitting layer or the electron transport layer comprises:

spin-coating a mixture solution including the host material and the guest material on the quantum dot light-emitting layer or the electron transport layer; wherein the spin-coating is at around 2000-5000 rpm for 60 s.

18. A method for manufacturing a light-emitting device comprising:

a quantum dot light-emitting layer, comprising a quantum dot material;

an electron transport layer; and an energy transfer layer, between the quantum dot light-emitting layer and the electron transport layer;

wherein:

the energy transfer layer is configured to facilitate a transfer of energy from the electron transport layer to the quantum dot light-emitting layer such that the quantum dot light-emitting layer has an improved electroluminescence efficiency compared with the quantum dot light-emitting layer having an energy transferred directly from the electron transport layer without the energy transfer layer;

the method comprising:

forming an energy transfer layer over a quantum dot light-emitting layer or an electron transport layer;

wherein:

the forming an energy transfer layer over the quantum dot light-emitting layer or the electron transport layer is via a deposition process, selected from one of spin-coating, spraying, printing, sputtering, electron beam evaporation, vacuum deposition, and chemical vapor deposition;

the deposition process is spin-coating, and the forming an energy transfer layer over the quantum dot light-emitting layer or the electron transport layer comprises:

spin-coating a mixture solution including the host material and the guest material on the quantum dot light-emitting layer or the electron transport layer; wherein after the forming, a thickness of the energy transfer layer is around 3-40 nm.

* * * * *